(12) United States Patent
    Choi et al.

(10) Patent No.: US 9,004,972 B2
(45) Date of Patent: Apr. 14, 2015

(54) ORGANIC LIGHT-EMITTING DISPLAY DEVICE WITH FRIT SEAL AND REINFORCING STRUCTURE

(71) Applicant: Samsung Display Co., Ltd., Yongin, Gyunggi-Do (KR)

(72) Inventors: Dong-Soo Choi, Yongin (KR); Dae Ho Lim, Yongin (KR); Jae Sun Lee, Yongin (KR); Jin Woo Park, Yongin (KR); Jong Woo Lee, Yongin (KR); Sang Wook Sin, Yongin (KR); Ung Soo Lee, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/858,883

(22) Filed: Apr. 8, 2013

(65) Prior Publication Data

US 2013/0237115 A1    Sep. 12, 2013

Related U.S. Application Data

(62) Division of application No. 11/541,047, filed on Sep. 29, 2006, now Pat. No. 8,415,880.

(30) Foreign Application Priority Data

Jan. 20, 2006    (KR) .................................. 2006-06148

(51) Int. Cl.
    *H01J 9/26*    (2006.01)
    *H01J 9/32*    (2006.01)
    (Continued)

(52) U.S. Cl.
    CPC    *H05B 33/04* (2013.01); *C03C 8/24* (2013.01); *C03C 17/40* (2013.01); *C03C 27/06* (2013.01);
    (Continued)

(58) Field of Classification Search
    CPC ... H01L 51/5237; H01L 51/524; H01L 51/56; H01L 2251/566; H01L 51/0032; H01L 23/28; G02F 1/1339; G02F 1/13452; G02F 2210/50; G02F 2202/023
    USPC ..................... 313/512, 504, 506; 445/23–25
    See application file for complete search history.

(56) References Cited

U.S. PATENT DOCUMENTS 3,966,449 A    6/1976    Foster
4,004,936 A    1/1977    Powell
(Continued)

FOREIGN PATENT DOCUMENTS

CN    1290121    4/2001
CN    1438825    8/2003
(Continued)

OTHER PUBLICATIONS

Chinese Office Action dated Mar. 8, 2013 for Chinese Patent Application No. CN 200710003941.0 which shares priority of Korean Patent Application No. KR 10-2006-0006148, filed Jan. 20, 2006 with captioned U.S. Appl. No. 13/858,883.
(Continued)

*Primary Examiner* — Thomas A Hollweg
(74) *Attorney, Agent, or Firm* — Knobbe Martens Olson & Bear LLP

(57) ABSTRACT

Disclosed is an organic light-emitting display device in which the substrate and the encapsulation substrate are attached to each other by using a frit. The organic light-emitting display device includes a first substrate including a pixel region in which an organic light-emitting diode is formed, and a non-pixel region. The organic light-emitting diode includes an organic light-emitting layer between a first electrode and a second electrode. A second substrate attached to the first substrate. A frit is provided between the non-pixel region of the first substrate and the second substrate to attach the first substrate and the second substrate. A reinforcement material of resin is formed outside the frit.

16 Claims, 9 Drawing Sheets

(51) Int. Cl.
*H05B 33/04* (2006.01)
*C03C 8/24* (2006.01)
*C03C 17/40* (2006.01)
*C03C 27/06* (2006.01)
*H01L 51/52* (2006.01)
*H01L 27/32* (2006.01)
*H01L 51/56* (2006.01)

(52) U.S. Cl.
CPC ...... *H01L 51/5246* (2013.01); *C03C 2217/252* (2013.01); *C03C 2217/253* (2013.01); *C03C 2218/34* (2013.01); *H01L 27/3244* (2013.01); *H01L 27/3281* (2013.01); *H01L 51/56* (2013.01)

(56) References Cited

U.S. PATENT DOCUMENTS

| | | | |
|---|---|---|---|
| 4,105,292 A | 8/1978 | Conder et al. | |
| 4,238,704 A | 12/1980 | Bonk et al. | |
| 4,702,566 A | 10/1987 | Tukude | |
| 4,826,297 A | 5/1989 | Kubo et al. | |
| 4,984,059 A | 1/1991 | Kubota et al. | |
| 5,610,742 A * | 3/1997 | Hinata et al. | 349/122 |
| 5,687,465 A * | 11/1997 | Hinata et al. | 29/402.01 |
| 5,808,719 A | 9/1998 | Fujiwara et al. | |
| 5,811,927 A | 9/1998 | Anderson et al. | |
| 5,874,804 A | 2/1999 | Rogers | |
| 5,965,907 A | 10/1999 | Huang et al. | |
| 6,005,653 A | 12/1999 | Matsuzawa | |
| 6,057,647 A | 5/2000 | Kurosawa et al. | |
| 6,087,717 A | 7/2000 | Ano et al. | |
| 6,109,994 A | 8/2000 | Cho et al. | |
| 6,195,142 B1 | 2/2001 | Gyotoku et al. | |
| 6,210,815 B1 | 4/2001 | Ooishi | |
| 6,211,938 B1 | 4/2001 | Mori | |
| 6,236,444 B1 * | 5/2001 | Konuma et al. | 349/151 |
| 6,288,487 B1 | 9/2001 | Arai | |
| 6,424,009 B1 | 7/2002 | Ju | |
| 6,452,323 B1 | 9/2002 | Byrum et al. | |
| 6,472,087 B1 | 10/2002 | Otani et al. | |
| 6,495,262 B2 | 12/2002 | Igeta | |
| 6,515,417 B1 | 2/2003 | Duggal et al. | |
| 6,551,724 B2 | 4/2003 | Ishii et al. | |
| 6,554,672 B2 | 4/2003 | Dunham et al. | |
| 6,555,025 B1 | 4/2003 | Krupetsky et al. | |
| 6,565,400 B1 | 5/2003 | Lee et al. | |
| 6,590,337 B1 | 7/2003 | Nishikawa et al. | |
| 6,603,254 B1 * | 8/2003 | Ando | 313/495 |
| 6,605,826 B2 * | 8/2003 | Yamazaki et al. | 257/72 |
| 6,624,572 B1 | 9/2003 | Kim et al. | |
| 6,646,284 B2 | 11/2003 | Yamazaki et al. | |
| 6,650,392 B2 * | 11/2003 | Iwanaga et al. | 349/153 |
| 6,660,547 B2 | 12/2003 | Guenther | |
| 6,671,029 B1 | 12/2003 | Choi | |
| 6,717,052 B2 | 4/2004 | Wang et al. | |
| 6,744,199 B1 | 6/2004 | Tanaka | |
| 6,791,660 B1 | 9/2004 | Hayashi et al. | |
| 6,831,725 B2 | 12/2004 | Niiya | |
| 6,833,668 B1 | 12/2004 | Yamada et al. | |
| 6,861,801 B2 | 3/2005 | Kim et al. | |
| 6,878,467 B2 | 4/2005 | Chung et al. | |
| 6,896,572 B2 | 5/2005 | Park et al. | |
| 6,914,661 B2 | 7/2005 | Masuda et al. | |
| 6,924,594 B2 | 8/2005 | Ogura et al. | |
| 6,936,963 B2 | 8/2005 | Langer et al. | |
| 6,956,324 B2 | 10/2005 | Yamazaki | |
| 6,956,638 B2 * | 10/2005 | Akiyama et al. | 349/187 |
| 6,965,195 B2 | 11/2005 | Yamazaki et al. | |
| 6,980,275 B1 * | 12/2005 | Konuma et al. | 349/154 |
| 6,993,537 B2 | 1/2006 | Buxton et al. | |
| 6,998,776 B2 | 2/2006 | Aitken et al. | |
| 7,023,518 B1 * | 4/2006 | Koyama et al. | 349/151 |
| 7,030,558 B2 | 4/2006 | Park et al. | |
| 7,098,589 B2 | 8/2006 | Erchak et al. | |
| 7,112,115 B1 * | 9/2006 | Yamazaki et al. | 445/25 |
| 7,141,925 B2 | 11/2006 | Wittmann et al. | |
| 7,145,290 B2 | 12/2006 | Kang | |
| 7,154,218 B2 | 12/2006 | Murakami et al. | |
| 7,178,927 B2 | 2/2007 | Seo | |
| 7,186,020 B2 | 3/2007 | Taya et al. | |
| 7,187,121 B2 | 3/2007 | Hasegawa et al. | |
| 7,193,218 B2 | 3/2007 | Nagano | |
| 7,193,364 B2 | 3/2007 | Klausmann et al. | |
| 7,193,366 B2 | 3/2007 | Tomimatsu et al. | |
| 7,202,602 B2 | 4/2007 | Anandan | |
| 7,211,938 B2 | 5/2007 | Tanaka | |
| 7,214,429 B2 | 5/2007 | Kato et al. | |
| 7,247,986 B2 | 7/2007 | Kang et al. | |
| 7,255,823 B1 * | 8/2007 | Guenther et al. | 264/263 |
| 7,291,977 B2 | 11/2007 | Kim et al. | |
| 7,306,346 B2 | 12/2007 | Fukuoka et al. | |
| 7,317,281 B2 | 1/2008 | Hayashi et al. | |
| 7,332,858 B2 | 2/2008 | Nomura et al. | |
| 7,342,357 B2 | 3/2008 | Sakano et al. | |
| 7,344,901 B2 | 3/2008 | Hawtof et al. | |
| 7,359,021 B2 | 4/2008 | Ota et al. | |
| 7,371,143 B2 | 5/2008 | Becken et al. | |
| 7,393,257 B2 | 7/2008 | Spencer et al. | |
| 7,407,423 B2 | 8/2008 | Aitken et al. | |
| 7,423,375 B2 | 9/2008 | Guenther et al. | |
| 7,425,166 B2 | 9/2008 | Burt et al. | |
| 7,425,518 B2 | 9/2008 | Yoshida et al. | |
| 7,426,010 B2 | 9/2008 | Lee et al. | |
| 7,452,738 B2 | 11/2008 | Hayashi et al. | |
| 7,474,375 B2 | 1/2009 | Kwak et al. | |
| 7,498,186 B2 | 3/2009 | Lee | |
| 7,514,280 B2 | 4/2009 | Lee | |
| 7,528,544 B2 | 5/2009 | Kwak et al. | |
| 7,537,504 B2 | 5/2009 | Becken et al. | |
| 7,564,185 B2 | 7/2009 | Song et al. | |
| 7,579,203 B2 * | 8/2009 | Yamazaki et al. | 438/35 |
| 7,579,220 B2 | 8/2009 | Ohnuma et al. | |
| 7,585,022 B2 | 9/2009 | Achilles et al. | |
| 7,586,254 B2 | 9/2009 | Kwak et al. | |
| 7,597,603 B2 | 10/2009 | Becken et al. | |
| 7,821,197 B2 | 10/2010 | Lee | |
| 7,825,594 B2 | 11/2010 | Lee et al. | |
| 7,834,550 B2 | 11/2010 | Lee et al. | |
| 7,837,530 B2 | 11/2010 | Park | |
| 7,944,143 B2 * | 5/2011 | Choi et al. | 313/512 |
| 8,038,495 B2 * | 10/2011 | Lee et al. | 445/23 |
| 8,063,561 B2 | 11/2011 | Choi et al. | |
| 8,120,249 B2 | 2/2012 | Choi et al. | |
| 8,125,146 B2 | 2/2012 | Park | |
| 8,164,257 B2 | 4/2012 | Choi et al. | |
| 8,299,705 B2 | 10/2012 | Choi | |
| 2001/0030730 A1 * | 10/2001 | Iwanaga et al. | 349/153 |
| 2002/0018911 A1 | 2/2002 | Bernius et al. | |
| 2002/0024051 A1 * | 2/2002 | Yamazaki et al. | 257/79 |
| 2002/0030440 A1 | 3/2002 | Yamazaki | |
| 2002/0125816 A1 | 9/2002 | Dunham et al. | |
| 2003/0066311 A1 | 4/2003 | Li et al. | |
| 2003/0077396 A1 * | 4/2003 | LeCompte et al. | 427/430.1 |
| 2003/0090615 A1 | 5/2003 | Park | |
| 2003/0122476 A1 | 7/2003 | Wang et al. | |
| 2003/0127976 A1 | 7/2003 | Kim et al. | |
| 2003/0155861 A1 | 8/2003 | Nishizawa et al. | |
| 2003/0184221 A1 | 10/2003 | Mishima | |
| 2003/0222567 A1 | 12/2003 | Ryu | |
| 2003/0227252 A1 | 12/2003 | Ikeya et al. | |
| 2004/0023591 A1 | 2/2004 | Matsuoka et al. | |
| 2004/0069017 A1 * | 4/2004 | Li et al. | 65/43 |
| 2004/0075380 A1 | 4/2004 | Takemoto et al. | |
| 2004/0104655 A1 | 6/2004 | Kodera et al. | |
| 2004/0135520 A1 | 7/2004 | Park et al. | |
| 2004/0169033 A1 | 9/2004 | Kuibira et al. | |
| 2004/0169174 A1 | 9/2004 | Huh et al. | |
| 2004/0201348 A1 | 10/2004 | Anandan | |
| 2004/0206953 A1 | 10/2004 | Morena et al. | |
| 2004/0207314 A1 * | 10/2004 | Aitken et al. | 313/504 |
| 2004/0256979 A1 | 12/2004 | Murakami et al. | |
| 2004/0263740 A1 | 12/2004 | Sakakura et al. | |
| 2005/0046338 A1 | 3/2005 | Park et al. | |

(56) References Cited

U.S. PATENT DOCUMENTS

| | | |
|---|---|---|
| 2005/0046346 A1 | 3/2005 | Tsuchiya et al. |
| 2005/0088595 A1* | 4/2005 | Akiyama et al. ............. 349/122 |
| 2005/0092927 A1* | 5/2005 | Nagano .................... 250/370.11 |
| 2005/0110404 A1 | 5/2005 | Park et al. |
| 2005/0127820 A1 | 6/2005 | Yamazaki et al. |
| 2005/0174046 A1 | 8/2005 | Hasegawa et al. |
| 2005/0218396 A1 | 10/2005 | Tsuchiya et al. |
| 2005/0231107 A1 | 10/2005 | Yamazaki et al. |
| 2005/0233885 A1 | 10/2005 | Yoshida et al. |
| 2005/0248270 A1 | 11/2005 | Ghosh et al. |
| 2005/0258744 A1 | 11/2005 | Kwak et al. |
| 2005/0269940 A1 | 12/2005 | Nishikawa et al. |
| 2005/0275342 A1 | 12/2005 | Yanagawa |
| 2006/0017382 A1 | 1/2006 | Hu et al. |
| 2006/0049396 A1 | 3/2006 | Pichler et al. |
| 2006/0082298 A1 | 4/2006 | Becken et al. |
| 2006/0084348 A1 | 4/2006 | Becken et al. |
| 2006/0261336 A1 | 11/2006 | Ohnuma et al. |
| 2006/0278965 A1 | 12/2006 | Foust et al. |
| 2006/0284556 A1* | 12/2006 | Tremel et al. .................. 313/512 |
| 2006/0290261 A1 | 12/2006 | Sawai et al. |
| 2007/0120478 A1 | 5/2007 | Lee et al. |
| 2007/0170324 A1 | 7/2007 | Lee et al. |
| 2007/0170423 A1 | 7/2007 | Choi et al. |
| 2007/0170605 A1 | 7/2007 | Lee et al. |
| 2007/0170845 A1 | 7/2007 | Choi et al. |
| 2007/0170850 A1 | 7/2007 | Choi et al. |
| 2007/0170855 A1 | 7/2007 | Choi et al. |
| 2007/0170857 A1 | 7/2007 | Choi et al. |
| 2007/0170859 A1 | 7/2007 | Choi et al. |
| 2007/0170860 A1 | 7/2007 | Choi et al. |
| 2007/0170861 A1 | 7/2007 | Lee et al. |
| 2007/0171637 A1 | 7/2007 | Choi |
| 2007/0172971 A1* | 7/2007 | Boroson ........................ 438/26 |
| 2007/0173167 A1 | 7/2007 | Choi |
| 2007/0176549 A1 | 8/2007 | Park |
| 2007/0177069 A1 | 8/2007 | Lee |
| 2007/0194690 A1 | 8/2007 | Lee |
| 2007/0194710 A1 | 8/2007 | Song et al. |
| 2007/0196949 A1 | 8/2007 | Lee |
| 2007/0197120 A1 | 8/2007 | Lee |
| 2007/0232182 A1 | 10/2007 | Park |
| 2008/0057260 A1* | 3/2008 | Buchhauser et al. ........... 428/76 |
| 2008/0074036 A1 | 3/2008 | Wang et al. |
| 2013/0234115 A1 | 9/2013 | Song et al. |

FOREIGN PATENT DOCUMENTS

| | | |
|---|---|---|
| CN | 1459996 | 12/2003 |
| CN | 1551686 | 12/2004 |
| CN | 1577413 | 2/2005 |
| CN | 1592508 | 3/2005 |
| CN | 161636 | 5/2005 |
| CN | 1617636 A | 5/2005 |
| CN | 1625309 | 6/2005 |
| CN | 1212662 | 7/2005 |
| CN | 1212662 C | 7/2005 |
| CN | 1669363 | 9/2005 |
| CN | 1670570 | 9/2005 |
| DE | 10 2004 0031670 A1 | 8/2005 |
| EP | 1 575 090 | 9/2005 |
| EP | 1 582 914 | 10/2005 |
| EP | 1 777 748 | 4/2007 |
| JP | 030-37933 | 2/1991 |
| JP | 04-138688 | 5/1992 |
| JP | 04-147217 | 5/1992 |
| JP | 04-301879 | 10/1992 |
| JP | 06-034983 | 2/1994 |
| JP | 06-337429 | 10/1994 |
| JP | 07-74583 | 3/1995 |
| JP | 09-258671 | 3/1997 |
| JP | 09-278483 | 10/1997 |
| JP | 10-074583 | 3/1998 |
| JP | 10-125463 | 5/1998 |
| JP | 10-161137 | 6/1998 |
| JP | 63-163423 | 7/1998 |
| JP | 10-201585 | 8/1998 |
| JP | 11-007031 | 1/1999 |
| JP | 11-202349 | 7/1999 |
| JP | 2000-173780 | 6/2000 |
| JP | 2000-306664 | 11/2000 |
| JP | 2001-022293 (A) | 1/2001 |
| JP | 2001-0122293 | 1/2001 |
| JP | 2001-052858 | 2/2001 |
| JP | 2001-055527 | 2/2001 |
| JP | 2001-110564 | 4/2001 |
| JP | 2001-126866 | 5/2001 |
| JP | 2001-155855 A | 6/2001 |
| JP | 2001-203076 | 7/2001 |
| JP | 2001-230072 | 8/2001 |
| JP | 2001-319775 | 11/2001 |
| JP | 2002-020169 | 1/2002 |
| JP | 2002-093576 | 3/2002 |
| JP | 2002-100472 | 4/2002 |
| JP | 2002-117777 | 4/2002 |
| JP | 2002-158088 | 5/2002 |
| JP | 2002-170664 | 6/2002 |
| JP | 2002-190267 | 7/2002 |
| JP | 2002-216951 | 8/2002 |
| JP | 2002-280169 | 9/2002 |
| JP | 2002-318547 | 10/2002 |
| JP | 2001-324662 | 11/2002 |
| JP | 2002-359070 | 12/2002 |
| JP | 2003-123966 | 4/2003 |
| JP | 2003-228302 | 8/2003 |
| JP | 2003-243160 | 8/2003 |
| JP | 2003 297552 | 10/2003 |
| JP | 2003-332061 | 11/2003 |
| JP | 2004-029552 | 1/2004 |
| JP | 2004 070351 | 3/2004 |
| JP | 2004-103337 | 4/2004 |
| JP | 2004-151656 | 5/2004 |
| JP | 2004-172048 | 6/2004 |
| JP | 2004-226880 | 8/2004 |
| JP | 2004-303733 | 10/2004 |
| JP | 2004-311385 | 11/2004 |
| JP | 2004-319103 | 11/2004 |
| JP | 2005-049808 | 2/2005 |
| JP | 2005-071984 | 3/2005 |
| JP | 2005-112676 | 4/2005 |
| JP | 2005-510831 | 4/2005 |
| JP | 2005-123089 | 5/2005 |
| JP | 2005-134476 A | 5/2005 |
| JP | 2005-158672 | 6/2005 |
| JP | 2005-190683 | 7/2005 |
| JP | 2005-216746 | 8/2005 |
| JP | 2005-222807 | 8/2005 |
| JP | 2005 251415 | 9/2005 |
| JP | 2005 258405 | 9/2005 |
| JP | 2005-267991 | 9/2005 |
| JP | 2005-302707 | 10/2005 |
| JP | 2005-302738 | 10/2005 |
| JP | 2005-340020 | 12/2005 |
| JP | 2006-156361 | 6/2006 |
| JP | 2006-244808 | 9/2006 |
| JP | 2006-244809 | 9/2006 |
| JP | 2006 524419 | 10/2006 |
| KR | 10-1995-0009817 | 4/1995 |
| KR | 10-1998-0017583 | 6/1998 |
| KR | 10-2000-0045292 | 7/2000 |
| KR | 10-2001-0079597 | 8/2001 |
| KR | 10-2001-0084380 | 9/2001 |
| KR | 10-2002-0051153 | 6/2002 |
| KR | 10-2003-0027169 | 4/2003 |
| KR | 10-2003-0044656 | 6/2003 |
| KR | 10-2003-0089447 | 11/2003 |
| KR | 10-2004-0011138 | 2/2004 |
| KR | 10-0442240 | 7/2004 |
| KR | 10-2005-0024592 | 3/2005 |
| KR | 10-2005-0061747 | 6/2005 |
| KR | 10-2005-0070543 | 7/2005 |
| KR | 10-2005-0076664 | 7/2005 |
| KR | 10-2005-0112318 | 11/2005 |

(56) References Cited

FOREIGN PATENT DOCUMENTS

| KR | 10-2005-0115408 | 12/2005 |
|---|---|---|
| KR | 10-2006-0005369 | 1/2006 |
| KR | 10-2006-0006148 | 1/2006 |
| KR | 10-2006-0006149 | 1/2006 |
| KR | 10-2006-0007025 | 1/2006 |
| KR | 10-2006-0007353 | 1/2006 |
| KR | 10-2006-0007354 | 1/2006 |
| KR | 10-2006-0007889 | 1/2006 |
| KR | 10-2006-0007890 | 1/2006 |
| KR | 10-2006-0007892 | 1/2006 |
| KR | 10-2006-0007893 | 1/2006 |
| KR | 10-2006-0007962 | 1/2006 |
| KR | 10-2006-0007963 | 1/2006 |
| KR | 10-2006-0008462 | 1/2006 |
| KR | 10-2006-0008463 | 1/2006 |
| KR | 10-2006-0008464 | 1/2006 |
| KR | 10-2006-0008761 | 1/2006 |
| KR | 10-2006-0008769 | 1/2006 |
| KR | 10-2006-0011831 | 2/2006 |
| KR | 10-2006-0016188 | 2/2006 |
| KR | 10-2006-0016316 | 2/2006 |
| KR | 10-2006-0016446 | 2/2006 |
| KR | 10-2006-0016856 | 2/2006 |
| KR | 10-2006-0016857 | 2/2006 |
| KR | 10-2006-0020109 | 3/2006 |
| KR | 10-2006-0025755 | 3/2006 |
| KR | 10-2006-0026816 | 3/2006 |
| KR | 10-2006-0027321 | 3/2006 |
| KR | 10-2006-0028571 | 3/2006 |
| KR | 10-2006-0035455 | 4/2006 |
| TW | 508976 | 11/2002 |
| TW | 515062 | 12/2002 |
| TW | 517356 | 1/2003 |
| TW | 564563 | 12/2003 |
| TW | 569166 | 1/2004 |
| TW | I227094 | 1/2005 |
| TW | I228686 | 3/2005 |
| TW | 200513144 | 4/2005 |
| TW | I237218 | 8/2005 |
| TW | I238026 | 8/2005 |
| TW | 200541379 | 12/2005 |
| TW | 200541382 | 12/2005 |
| TW | 200601873 | 1/2006 |
| TW | 200602336 | 1/2006 |
| TW | I256857 | 6/2006 |
| TW | I1258321 | 7/2006 |
| TW | 1I277125 | 3/2007 |
| TW | I292222 | 1/2008 |
| WO | WO 02/21557 | 3/2002 |
| WO | WO 03/005774 | 1/2003 |
| WO | WO 2004/095597 | 4/2004 |
| WO | WO 2004/094331 | 11/2004 |
| WO | WO 2004/112160 | 12/2004 |
| WO | WO 2005/050751 | 6/2005 |
| WO | WO 2006/045067 | 4/2006 |
| WO | WO 2007/067420 | 6/2007 |

OTHER PUBLICATIONS

Chinese Office Action dated Aug. 1, 2008 for Chinese Application No. 200710001301.6 with English translation.
Chinese Office Action dated Aug. 1, 2008 for Chinese Application No. 200710001571.7 with English translation.
Chinese Office Action dated Sep. 26, 2008 for Chinese Application No. 200710000143.2 with English translation.
Chinese Office Action dated Oct. 10, 2008 for Chinese Application No. 200710003941.0.
Chinese Office Action dated Oct. 10, 2008 for Chinese Application No. 200710001782.0.
Chinese Office Action dated Oct. 10, 2008 for Chinese Application No. 200710004080.8.
Chinese Office Action dated Dec. 19, 2008 for Chinese Application No. 200710007253.1 with English translation.
Chinese Office Action dated May 8, 2009 for Chinese Application No. 200710004080.8.
Chinese Office Action dated on Jan. 8, 2010 for Chinese Application No. 200710003941.0.
European Search Report dated May 24, 2007 for European Application No. 07101295.9.
European Search Report dated Jun. 6, 2007 for European Application No. 07101294.2.
European Search Report dated Sep. 24, 2010 for European Application No. 07250311.3.
European Search Report dated Jan. 5, 2011 for European Application No. 07250270.1.
European Extended Search Report dated Jan. 5, 2011 for European Application No. 07250267.7.
European Extended Search Report dated Feb. 7, 2011 for European Application No. 07250317.0.
European Extended Search Report dated Feb. 24, 2011 for European Application No. 07250336.0.
European Extended Search Report dated Aug. 2, 2011 for European Application No. 07250355.0.
European Search Report dated Nov. 28, 2011 for European Application No. 07250228.9.
Japanese Office Action dated May 19, 2009 for Japanese Application No. 2006-1930232.
Japanese Office Action dated May 19, 2009 for Japanese Application No. 2006-193034.
Japanese Office Action dated on May 19, 2009 for Japanese Application No. 2006-189628.
Japanese Office Action dated Jun. 30, 2009 for Japanese Application No. 2006-222065.
Japanese Office Action dated Jul. 14, 2009 for Japanese Application No. 2006-151960.
Japanese Office Action dated Jul. 14, 2009 for Japanese Application No. 2006-165210.
Japanese Office Action dated Jul. 28, 2009 for Japanese Application No. 2006-153567.
Japanese Office Action dated Jul. 28, 2009 for Japanese Application No. 2006-178508.
Japanese Office Action dated Sep. 8, 2009 for Japanese Application No. 2007-011996.
Japanese Office Action dated Oct. 20, 2009 for Japanese Application No. 2006-189628.
Japanese Office Action dated Oct. 27, 2009 for Japanese Application No. 2006-256002.
Japanese Office Action dated Dec. 1, 2009 for Japanese Application No. 2006-193033.
Japanese Office Action dated Jun. 15, 2010 for Japanese Application No. 2006-151960.
Japanese Office Action dated May 31, 2011, for Japanese Application No. 2010-23888.
Japanese Office Action dated Jul. 5, 2011 for Japanese Application No. 2006-193032.
Japanese Office Action dated Jan. 10, 2012 for Japanese Application No. JP 2006-193032.
Japanese Office Action dated Feb. 14, 2012 for Japanese Application No. JP 2006-256002.
Korean Office Action dated Sep. 26, 2006 for Korean Application No. 10-2006-0006148.
Korean Office Action dated Sep. 26, 2006 for Korean Application No. 10-2006-0007890.
Korean Office Action dated Sep. 26, 2006 for Korean Application No. 10-2006-0007963.
Korean Office Action dated Feb. 12, 2007 for Korean Application No. 10-2006-0035455.
Korean Notice of Allowance dated Jul. 3, 2007 for Korean Application No. 10-2006-0035455.
Korean Notice of Allowance dated Aug. 2, 2007 for Korean Application No. 10-2006-0016188.
Taiwanese Office Action dated Jan. 18, 2010 for Taiwanese Application No. 95145107.
Taiwanese Office Action dated Apr. 2, 2010 for Taiwanese Application No. 95144932.
Taiwanese Office Action dated Feb. 17, 2011 for Taiwanese Application No. 95143705.

(56) References Cited

OTHER PUBLICATIONS

Taiwanese Office Action dated Feb. 17, 2011 for Taiwanese Application No. 095143707.
Taiwanese Notice of Allowance dated Nov. 30, 2011 for Taiwanese Application No. 096102645.
Taiwanese Office Action dated Dec. 22, 2011 for Taiwanese Application No. 096101663.
Taiwanese Office Action dated Jun. 29, 2012 for Taiwanese Application No. 096101663.
U.S. Office Action dated Nov. 15, 2007 in U.S. Appl. No. 11/541,009.
U.S. Office Action dated Nov. 28, 2007 in U.S. Appl. No. 11/540,150.
U.S. Office Action dated Jun. 19, 2008 in U.S. Appl. No. 11/541,009.
U.S. Office Action dated Aug. 21, 2008 in U.S. Appl. No. 11/540,150.
U.S. Office Action dated Dec. 3, 2008 in U.S. Appl. No. 11/541,009.
U.S. Office Action dated Dec. 8, 2008 in U.S. Appl. No. 11/540,021.
U.S. Office Action dated Feb. 2, 2009 in U.S. Appl. No. 11/529,916.
U.S. Office Action dated Feb. 11, 2009 in U.S. Appl. No. 11/529,883.
U.S. Office Action dated Feb. 19, 2009 in U.S. Appl. No. 11/540,024.
U.S. Office Action dated Apr. 3, 2009 in U.S. Appl. No. 11/529,891.
U.S. Office Action dated Apr. 3, 2009 in U.S. Appl. No. 11/541,055.
U.S. Office Action dated Apr. 27, 2009 in U.S. Appl. No. 11/540,021.
U.S. Office Action dated Apr. 30, 2009 in U.S. Appl. No. 11/540,151.
U.S. Office Action dated May 4, 2009 in U.S. Appl. No. 11/529,995.
U.S. Office Action dated May 8, 2009 in U.S. Appl. No. 11/540,149.
U.S. Office Action dated Jul. 17, 2009 in U.S. Appl. No. 11/529,883.
U.S. Office Action dated Aug. 19, 2009 in U.S. Appl. No. 11/529,914.
U.S. Office Action dated Oct. 29, 2009 in U.S. Appl. No. 11/529,891.
U.S. Office Action dated Dec. 30, 2009 in U.S. Appl. No. 11/541,139.
U.S. Office Action dated Dec. 30, 2009 in U.S. Appl. No. 11/541,048.
U.S. Office Action dated Mar. 29, 2010 in U.S. Appl. No. 11/541,055.
U.S. Office Action (Advisory Action) dated May 19, 2010 in U.S. Appl. No. 11/529,914.
U.S. Office Action dated May 25, 2010 in U.S. Appl. No. 11/529,995.
U.S. Office Action dated Aug. 19, 2010 in U.S. Appl. No. 11/529,914.
U.S. Office Action dated Nov. 29, 2010 in U.S. Appl. No. 11/529,916.
U.S. Office Action dated Mar. 24, 2011 in U.S. Appl. No. 11/540,103.
U.S. Final Office Action dated May 12, 2011 in U.S. Appl. No. 11/529,916.
U.S. Office Action/Notice of Allowance dated Jul. 12, 2011 in U.S. Appl. No. 11/541,139.
U.S. Office Action dated Aug. 7, 2012 in U.S. Appl. No. 11/540,150.
U.S. Office Action dated Oct. 23, 2012 in U.S. Appl. No. 11/529,891.
U.S. Office Action dated Nov. 7, 2012 in U.S. Appl. No. 11/540,150.
U.S. Office Action dated Jan. 7, 2013 in U.S. Appl. No. 11/540,150.
U.S. Office Action dated Feb. 8, 2013 in U.S. Appl. No. 11/529,891.
Japanese Office Action dated Jun. 1, 2010 for Japanese Application No. 2006-193032.

\* cited by examiner

ORGANIC LIGHT-EMITTING DISPLAY DEVICE WITH FRIT SEAL AND REINFORCING STRUCTURE

CROSS-REFERENCE TO RELATED APPLICATIONS

This application is a divisional of U.S. patent application Ser. No. 11/541,047 filed Sep. 29, 2006, which claims the benefit of Korean Patent Application No. 2006-06148, filed on Jan. 20, 2006, in the Korean Intellectual Property Office, the disclosure of which is incorporated herein by reference in its entirety. This application is related to and incorporates herein by reference the entire contents of the following applications that were previously filed concurrently:

| Title | Atty. Docket No. | Application/ Pat. No. | Filing/Issue Date |
|---|---|---|---|
| ORGANIC LIGHT EMITTING DISPLAY AND METHOD OF FABRICATING THE SAME | SDCSHN.043AUS | 11/512,651 7,795,803 | 29-Aug-2006 14-Sep-2010 |
| ORGANIC LIGHT EMITTING DISPLAY DEVICE AND A METHOD OF MANUFACTURING THEREOF | SDCSHN.045AUS | 11/540,083 | 29-Sep-2006 |
| ORGANIC LIGHT EMITTING DISPLAY AND METHOD OF FABRICATING THE SAME | SDCSHN.048AUS | 11/540,150 | 29-Sep-2006 |
| METHOD FOR PACKAGING ORGANIC LIGHT EMITTING DISPLAY WITH FRIT SEAL AND REINFORCING STRUCTURE | SDCSHN.052AUS | 11/540,084 7,514,280 | 29-Sep-2006 07-Apr-2009 |
| ORGANIC ELECTROLUMINESCENCE DISPLAY DEVICE AND MANUFACTURING METHOD THEREOF | SDCSHN.053AUS | 11/540,084 7,514,280 | 29-Sep-2006 07-Apr-2009 |
| ORGANIC ELECTROLUMINESCENCE DISPLAY DEVICE AND MANUFACTURING METHOD THEREOF | SDCSHN.054AUS | 11/540,417 7,385,347 | 29-Sep-2006 10-Jun-2008 |
| METHOD OF SEALING AN ORGANIC LIGHT EMITTING DISPLAY BY MEANS OF GLASS FRIT SEAL ASSEMBLY | SDCSHN.056AUS | 11/540,008 7,837,530 | 29-Sep-2006 23-Nov-2010 |
| ORGANIC LIGHT EMITTING DISPLAY DEVICE AND MANUFACTURING METHOD THEREOF | SDCSHN.060AUS | 11/529,995 8,299,705 | 29-Sep-2006 30-Oct-2012 |
| ORGANIC LIGHT-EMITTING DISPLAY DEVICE AND MANUFACTURING METHOD OF THE SAME | SDCSHN.062AUS | 11/540,157 8,038,495 | 29-Sep-2006 18-Oct-2011 |
| ORGANIC LIGHT EMITTING DISPLAY AND FABRICATING METHOD OF THE SAME | SDCHN.063AUS | 11/540,149 7,825,594 | 29-Sep-2006 02-Nov-2010 |
| ORGANIC LIGHT EMITTING DISPLAY OF MOTHER SUBSTRATE UNIT AND METHOD OF FABRICATING THE SAME | SDCSHN.064AUS | 11/540,066 | 29-Sep-2006 |
| ORGANIC LIGHT EMITTING DISPLAY DEVICE AND METHOD OF MANUFACTURING THE SAME | SDCSHN.066AUS | 11/540,004 7,749,039 | 29-Sep-2006 06-Jul-2010 |
| FLAT PANEL DISPLAY AND METHOD FOR MAKING THE SAME | SDCSHN.067AUS | 11/595,217 | 09-Nov-2006 |

BACKGROUND

1. Field of the Invention

The present invention relates to organic light-emitting display devices and, more particularly, to packaging such devices.

2. Discussion of Related Art

An organic light-emitting display device is one of the flat panel displays in which an electron injected to one electrode and a hole injected to the other electrode bind to each other in an organic light-emitting layer when the organic light-emitting layer is arranged between facing electrodes and a voltage is applied to both electrodes, wherein, when luminescent molecules of the light-emitting layer are excited by the binding of the electron and the hole, energy is emitted by returning to a ground state, and then converted into the light. The organic light-emitting display devices exhibiting such a light-emission principle has drawn attention as a next-generation display since they are excellent in visibility, and they may be also manufactured in a light weight and thin shape and driven at a low voltage. U.S. Pat. No. 6,998,776 B2 discloses that an organic light-emitting display includes a first substrate plate, a second substrate plate and a frit connecting the plates.

SUMMARY OF CERTAIN INVENTIVE ASPECTS

One aspect of the invention provides an organic light-emitting display device, which may comprise: a first substrate; a second substrate placed over the first substrate; an array of organic light-emitting pixels interposed between the first and second substrates; a frit seal interposed between the first substrate and the second substrate while surrounding the array, wherein the frit seal, the first substrate and the second substrate in combination define an enclosed space in which the array is located; and a structure comprising a portion interposed between the first and second substrates, wherein the structure is located outside the enclosed space. The structure may improve structural strength of the device.

In the foregoing device, the portion of the structure may contact the frit seal. The structure may not contact the frit seal. The structure may comprise another portion that is not interposed between the first and second substrates. The structure may comprise a cured polymeric resin. The structure may comprise at least one selected from the group consisting of cyanoacrylate, acrylate, epoxy, acrylate, urethane acrylate and cured polymers of two or more of the foregoing. The structure substantially surrounds the frit seal. The structure may be configured to improve sealing of the enclosed space.

Still in the forgoing device, the frit seal may be connected to the first substrate via a material formed between the frit seal and the first substrate. The structure may contact the first substrate. The structure may be connected to the first substrate via another material between the structure and the first substrate. The first substrate may comprise a first edge and the second substrate may comprise a second edge extending generally along the first edges, and wherein the frit seal may extend along the first and second edge while apart from the first and second edges, wherein the structure may contact the first and second substrates, and extends along the first and second edges. The structure may contact first and second edges. The first substrate comprises a first edge and the frit seal may be apart from the first edge from about 0.3 to about 0.7 mm. The first substrate may comprise a front surface of the device, the front surface facing away from the second substrate, and wherein the structure may provide a side surface of the device. The side surface may be substantially planar. The frit seal may comprise one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

Another aspect of the invention provides a method of making an organic light-emitting display device, which may comprises: providing an unfinished device comprising a first substrate, a second substrate placed over the first substrate, an array of organic light-emitting pixels interposed between the first and second substrates, and a frit seal interposed between the first substrate and the second substrate while surrounding the array, wherein the frit seal, the first substrate and the second substrate in combination define an enclosed space, in which the array is located; and forming a structure outside the enclosed space such that the structure comprises a portion interposed between the first and second substrates.

In the foregoing method, forming may comprise placing a curable liquid material in the vicinity of the frit seal while not contacting the frit seal, whereby at least part of the curable liquid material may spontaneously move toward the frit seal by capillary action, and solidifying the curable liquid material, thereby forming the structure. The first substrate may comprise a first surface and the second substrate may comprise a second surface facing the first surface, wherein the first surface, second surface and the frit seal may together define a gap outside the enclosed space, and wherein forming the structure may comprise applying a curable material into the gap. The curable material may be liquid, and the curable material spontaneously moves toward the frit seal when being applied into the gap. Forming the structure may further comprise curing the curable material by activating a curing process of the curable material. The gap may be formed throughout the periphery of the unfinished device, and wherein forming the structure may comprise applying the curable material into the gap substantially throughout the periphery of the unfinished device.

Still in the foregoing method, forming the structure may comprise placing a curable material in vicinity of the frit seal, and curing the curable material. Forming the structure may comprise providing a dispenser containing the curable material, applying the curable material onto a surface of the unfinished device using the dispenser, whereby a portion of the curable material is formed between the first and second substrates, and curing the curable material. Forming the structure may comprise providing a medium retaining the curable material, applying the curable material on a surface of the unfinished device using the medium, whereby a portion of the curable material is formed between the first and second substrates, and curing the curable material. Forming the structure may comprise providing a curable material in liquid, dipping a periphery of the unfinished device into the liquid curable material, whereby a portion of the liquid curable material is formed between the first and second substrates; and curing the curable material.

Still another aspect of the present invention provides an organic light-emitting display device further including a reinforcement material of resin in the outside of a frit.

Further aspect of the present invention provides an organic light-emitting display device including a first substrate comprising a pixel region in which an organic light-emitting diode or pixels is formed in a surface thereof, and a non-pixel region, the organic light-emitting diode comprising an organic light-emitting layer between a first electrode and a second electrode; a second substrate coalesced to one region including the pixel region of the substrate; a frit provided between the non-pixel region of the first substrate and the second substrate and attaching the first substrate and the second substrate to each other; and a reinforcement material of resin formed outside of the frit.

Still further aspect of the present invention provides a method for preparing an organic light-emitting display device, including a substrate including an organic light-emitting diode, and an encapsulation substrate for encapsulating at least a pixel region of the substrate, the method including the first step of applying and sintering a frit paste to an edge region of the encapsulation substrate; the second step of coalescing the substrate and the encapsulation substrate to each other; the third step of melting the frit to attach the substrate and the encapsulation substrate to each other by irradiating a laser or an infrared ray to the frit between the substrate and the encapsulation substrate, both coalesced to each other; and the fourth step of injecting the reinforcement material into the outside of the frit between the substrate and the encapsulation substrate. The organic light-emitting diode may be completely protected from the open air by completely coalescing a substrate and a encapsulation substrate to each other using a frit and solving brittleness of the organic light-emitting display device when the frit is used herein.

BRIEF DESCRIPTION OF THE DRAWINGS

These and other aspects and advantages of the invention will become apparent and more readily appreciated from the following description of embodiments, taken in conjunction with the accompanying drawings.

DETAILED DESCRIPTION OF EMBODIMENTS

Hereinafter, various embodiments of the present invention will be described in detail. However, it would be appreciated by those skilled in the art that modifications and changes might be made in the embodiments without departing from the principles and spirit of the invention. For example, changes of materials constituting an organic light-emitting layer, absence of color-changing layers or green-barrier layers, and changes of height and width may be easily made by those skilled in the art.

An organic light emitting display (OLED) is a display device comprising an array of organic light emitting diodes. Organic light emitting diodes are solid state devices which include an organic material and are adapted to generate and emit light when appropriate electrical potentials are applied.

Figure 7A:
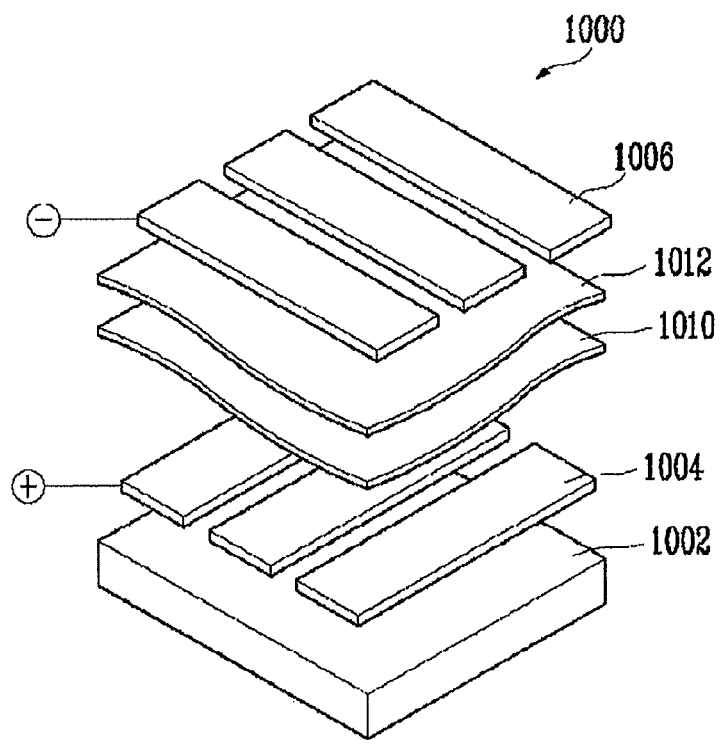
FIG. 7A is a schematic exploded view of a passive matrix type organic light emitting display device in accordance with one embodiment.
Figure 7B:
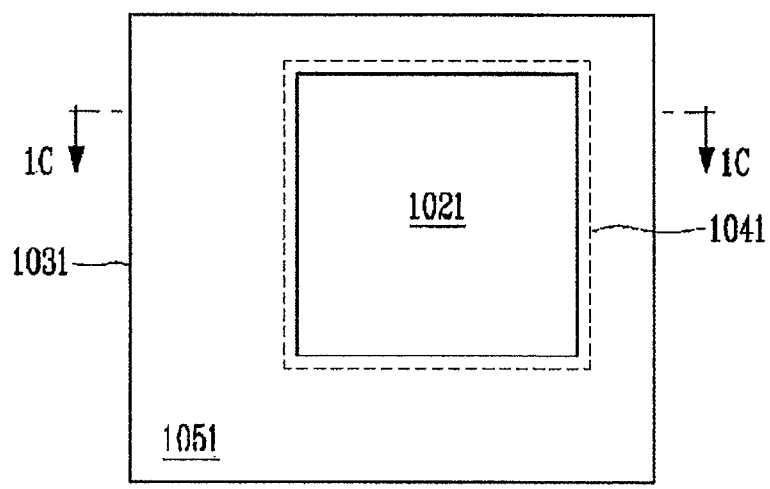
FIG. 7B is a schematic exploded view of an active matrix type organic light emitting display device in accordance with one embodiment.

OLEDs can be generally grouped into two basic types dependent on the arrangement with which the stimulating electrical current is provided. FIG. 7A schematically illustrates an exploded view of a simplified structure of a passive matrix type OLED 1000. FIG. 7B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 7A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 7B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 7C:
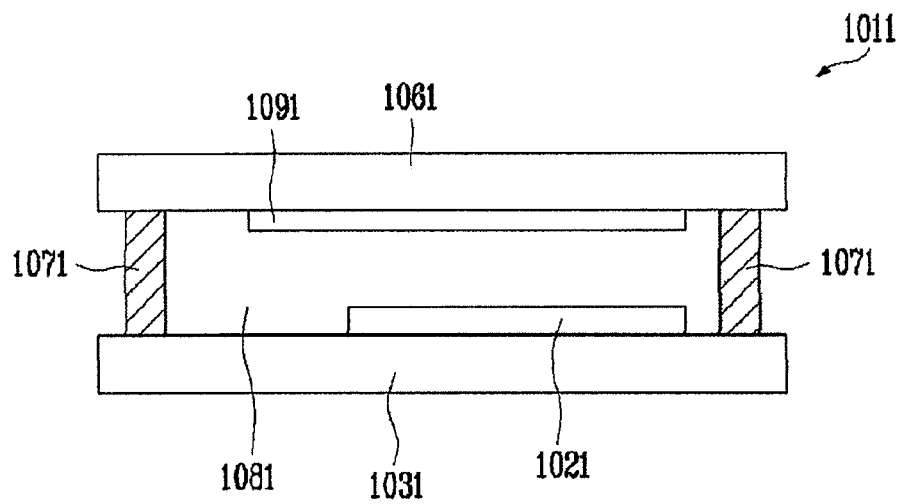
FIG. 7C is a schematic top plan view of an organic light emitting display in accordance with one embodiment.

In many embodiments, an OLED pixel array 1021 comprising a plurality of organic light emitting pixels is arranged over a substrate 1002 as shown in FIG. 7C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 7D:
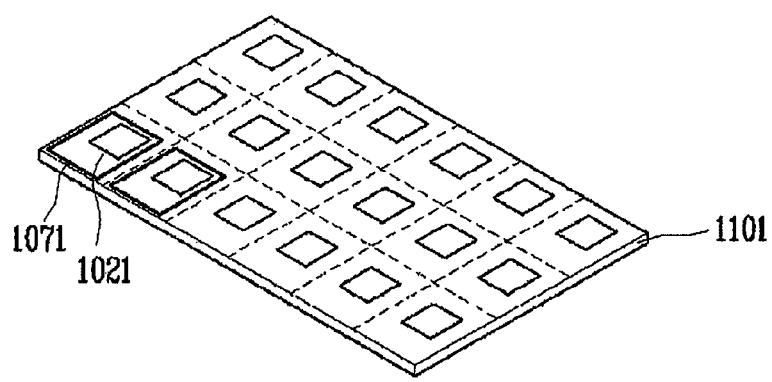
FIG. 7D is a cross-sectional view of the organic light emitting display of FIG. 7C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 7D schematically illustrates a cross-section of an encapsulated OLED device 1011 having a layout of FIG. 7C and taken along the line d-d of FIG. 7C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 7D. The width varies among embodiments and ranges from about 300 µm to about 3000 µm, optionally from about 500 µm to about 1500 µm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 7D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a fit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 7E:
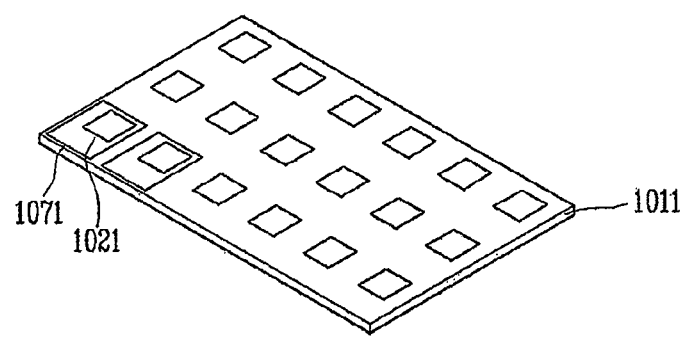
FIG. 7E is a schematic perspective view illustrating mass production of organic light emitting devices in accordance with one embodiment.

In some embodiments, OLED devices 1011 are mass produced. In an embodiment illustrated in FIG. 7E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 7D. In certain embodiments, the individual OLED devices 1011 then further undergo additional packaging operations to further improve the sealing formed by the frit seal 1071 and the top and bottom substrates 1061, 1002.

Figure 1:
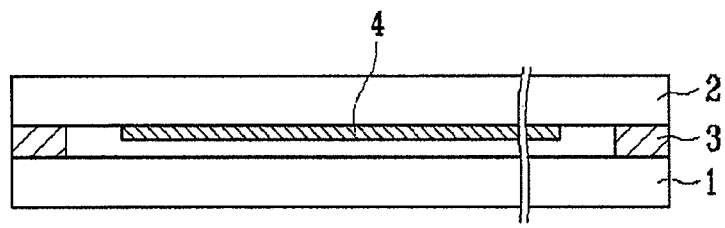
FIG. 1 is a cross-sectional view showing an organic light-emitting display device.

One problem of the organic light-emitting display device is that the device can be deteriorated when moisture contacts organic materials constituting the organic light-emitting elements. FIG. 1 is a cross-sectional view showing an encapsulation structure of an organic light-emitting device that can prevent moisture from contacting organic materials. In the illustrated structure, the organic light-emitting display device includes a deposition substrate 1, an encapsulation substrate 2, a sealing material 3 and a moisture-absorbing material 4. The deposition substrate 1, which is equivalent to the bottom plate 1002, includes a pixel region including at least one organic light-emitting diode or pixel, and a non-pixel region formed outside the pixel region, and the encapsulation substrate 2, which is equivalent to the top plate 1061, is attached against a surface in which an organic light-emitting diode of the deposition substrate 1 is formed.

In order to attach the deposition substrate 1 to the encapsulation substrate 2, the sealing material 3 is applied along edges of the deposition substrate 1 and the encapsulation substrate 2, and the sealing material 3 is then cured using UV irradiation, etc. A moisture-absorbing material 4 is included in the encapsulation substrate 2 for the purpose of capturing moisture and certain gases such as hydrogen, oxygen. Even in the illustrated device, however, the sealing material 3 may not completely prevent moisture or air entering into the enclosed space. Also, there may be cracks in the sealing material 3 and in the interfacial area where the sealing material 3 contacts the substrate for various reasons.

Figure 2:
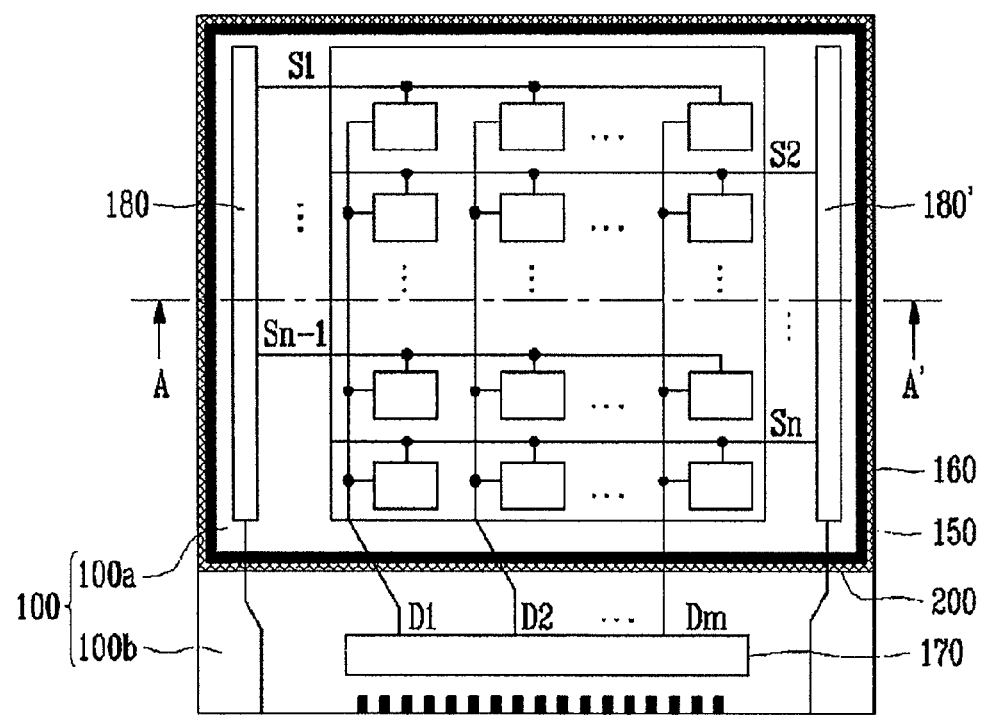
FIG. 2 is a plan view showing an organic light-emitting display device according to one embodiment of the present invention.
Figure 3A:
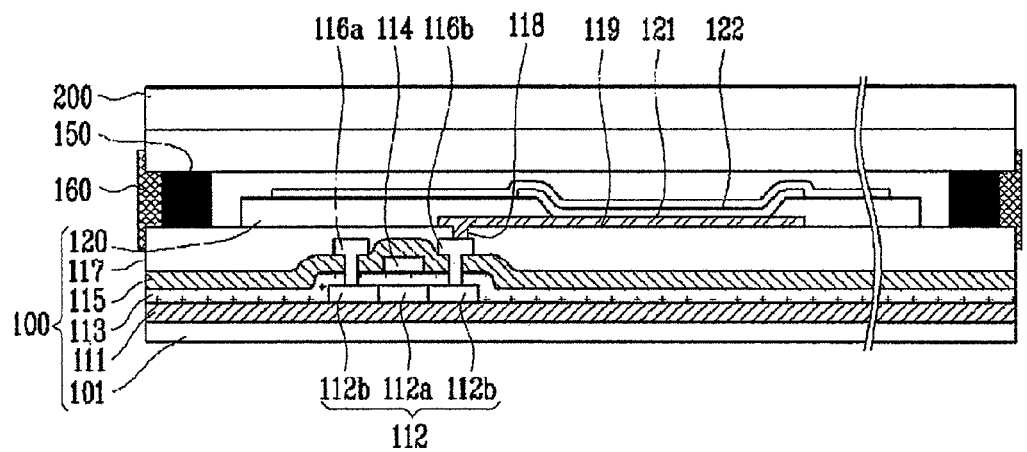
FIGS. 3a and 3b are cross-sectional views showing an organic light-emitting display device according to one embodiment of the present invention, respectively.
Figure 3B:
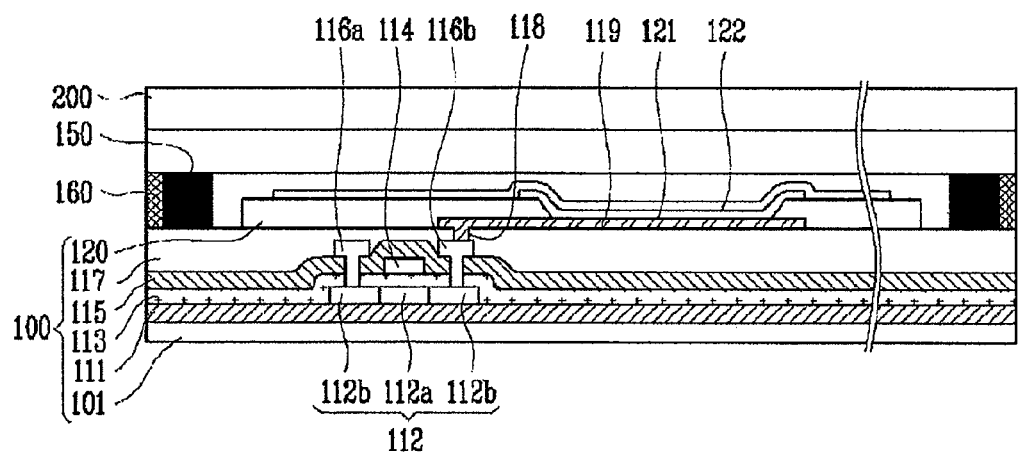
Figure 4A:
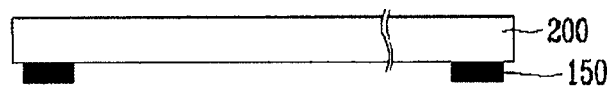
FIGS. 4a to 4d are cross-sectional views showing a process for preparing an organic light-emitting display device according to an embodiment of the present invention.
Figure 4B:
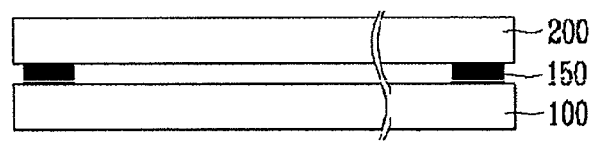
Figure 4C:
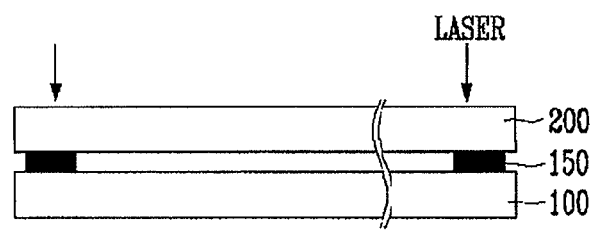
Figure 4D:
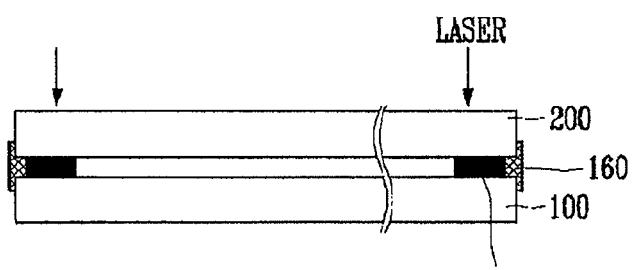

FIG. 2 is a simple plan view showing an organic light-emitting display device according to an embodiment of the present invention; and FIGS. 3*a* and 3*b* are cross-sectional views taken along a line A-A' of FIG. 2. Referring to figures, the organic light-emitting display device includes a substrate 100, an encapsulation substrate 200, a frit 150 and a reinforcement material 160. For the sake of convenience, the deposition substrate 101 refers to a base, on which circuits and layers are formed, and the substrate 100 refers to an unfinished product including the deposition substrate 101 and circuits and layers formed thereon, including an array of organic light emitting pixels.

The substrate 100 is a plate including an organic light-emitting diode or pixel, and includes a pixel region 100*a* in which at least one organic light-emitting diode is formed, and a non-pixel region 100*b* formed outside the pixel region 100*a*, the organic light-emitting diode including a first electrode 119, an organic layer 121 and a second electrode 122. Hereinafter, the pixel region 100*a* is referred to as a region for displaying a predetermined image using the light emitted from an organic light-emitting diode, and the non-pixel region 100*b* is referred to as the entire region except the pixel region 100*a* on the substrate 100 in the description of this application.

The pixel region 100*a* includes a plurality of scan lines (S1 to Sm) arranged in a horizontal direction, and a plurality of data lines (D1 to Dm) arranged in a vertical direction, and a plurality of pixels are formed in the scan lines (S1 to Sm) and the data lines (D1 to Dm), the pixels receiving signals from a driver integrated circuit 300 for driving organic light-emitting diodes or pixels. Also, a driver integrated circuit (Driver IC) for driving an organic light-emitting diode, and metal wirings electrically attached to each of the scan lines (S1 to Sm) and the data lines (D1 to Dm) of the pixel region are formed in the non-pixel region 100*b*. In an embodiment, the driver integrated circuit includes a data driving unit 170 and scan driving units 180, 180'.

The organic light-emitting diodes or pixels are driven in an active matrix method, as shown in the drawings, and its configuration will be described in brief. A buffer layer 111 is formed on a base substrate 101, and the buffer layer 111 is formed of insulating materials such as silicon oxide ($SiO_2$) or silicon nitride (SiNx). The buffer layer 111 prevents the substrate 100 from being damaged by factors such as heat from the outside, etc. On at least one region of the buffer layer 111 is formed a semiconductor layer 112 including an active layer 112*a* and an ohmic contact layer 112*b*. On the semiconductor layer 112 and the buffer layer 111 is formed a gate insulating layer 113, and on one region of the gate insulating layer 113 is formed a gate electrode 114 having a size corresponding to a width of the active layer 112*a*.

An interlayer insulating layer 115 includes the gate electrode 114 and is formed on the gate insulating layer 113, and source and drain electrodes 116*a* and 116*b* are formed on a predetermined region of the interlayer insulating layer 115. The source and drain electrodes 116*a* and 116*b* are formed so that they can be connected to one exposed region of the ohmic contact layer 112*b*, and an overcoat 117 includes the source and drain electrodes 116*a*, 116*b* and is formed on the interlayer insulating layer 115. A first electrode 119 is formed on one region of the overcoat 117, wherein the first electrode 119 is connected with one exposed region of either one of the source and drain electrodes 116*a* and 116*b* by means of a via hole 118.

A pixel definition layer 120 includes the first electrode 119 and is formed on the overcoat 117, the pixel definition layer 120 having an opening (not shown) to which at least one region of the first electrode 119 is exposed. An organic layer 121 is formed on the opening of the pixel definition layer 120, and a second electrode layer 122 includes the organic layer 121 and is formed on the pixel definition layer 120. In an embodiment, a passivation layer may be further formed in an upper portion of the second electrode layer 122. In embodiments, various modifications and changes may be made in an active matrix structure or a passive matrix structure of the organic light-emitting device, and their detailed descriptions are omitted since each of the structures can be understood from the description of the invention by those skilled in the art.

An encapsulation substrate 200 is a member for encapsulating at least one pixel region 100*a* of the substrate in which the organic light-emitting diode is formed, and is formed of transparent materials in the case of top emission or dual emission and formed of translucent materials in the case of bottom emission. Various materials of the encapsulation substrate 200 can be used, for example, a glass may be used in an embodiment, for example in the case of the top emission, although not limited thereto.

The encapsulation substrate 200 is formed in a plate shape in an embodiment, and encapsulates a pixel region in which the organic light-emitting diode is formed on at least the substrate 100. For example, the entire region is encapsulated except a data driving unit and a pad unit in an embodiment. The frit 150 is formed between the encapsulation substrate 200 and the non-pixel region 100*b* of the substrate 100 to seal the pixel region 100*a* so that the air or any fluid is prevented from passing through or being infiltrated. In an embodiment the frit 150 forms a line spaced apart at a constant distance from an edge of an interface in which the encapsulation substrate 200 and the substrate 100 are coalesced to each other. This is to secure a space that forms a reinforcement material 160, as described later, and a spaced distance ranges from about 0.3 to about 0.7 mm. In an embodiment, the fit 150 includes a glass material, a moisture-absorbing material for absorbing a laser, a filler for reducing a thermal expansion coefficient, etc., and is applied to the encapsulation substrate 200 in a state of frit paste, melted and cured in an interface between the encapsulation substrate 200 and the substrate 100 using a laser or an infrared ray to seal the interface between the encapsulation substrate 200 and the substrate 100. In an embodiment, the line in which the frit 150 is formed has a width of about 0.5 to about 1.5 mm.

Meanwhile, in an exemplary embodiment, configurations and materials of a surface of the substrate 100 with which the frit 150 is in direct contact can be used although not limited thereto. In an embodiment, the frit is not overlapped with a metal wiring as possible as it is, except a period of a metal wiring directly connected with a driver integrated circuit, although not limited thereto. If the frit 150 is overlapped with the metal wiring, the metal wiring may be damaged due to irradiation of a laser or an infrared ray. In an embodiment, a reinforcement material or structure 160 is formed in an outer side of the line of the frit 150. In an embodiment the reinforcement material 160 may prevent an organic light-emitting display device from being damaged or broken, and function as a sealing material if the frit 150 is not attached or its adhesive force is reduced when it is deliquesced by other materials. The reinforcement material 160 can be formed spaced apart at a predetermined distance form the frit 150, or formed adjacent to the frit 150. In an embodiment, the reinforcement material 160 formed in the outside of the frit 150 may be formed in a gap between the substrate 100 and the encapsulation substrate 200, and side surfaces of the substrate 100 and the encapsulation substrate 200, as shown in FIG. 3a. In another embodiment, the reinforcement material 160 may be also formed only in a gap between the substrate 100 and the encapsulation substrate 200, as shown in FIG. 3b.

In an embodiment, curable materials, which are naturally cured, thermally cured or UV-cured, may be used. Liquid materials can be used for forming the reinforcement material or structure 160. For example, cyanoacrylate may be used as the naturally cured material; acrylate may be used as the material that is thermally cured at a temperature of about 80☐ or less; and epoxy, acrylate and urethane acrylate may be used as the UV-cured materials.

Hereinafter, embodiments of a method for packaging an organic light-emitting display device according to the present invention will be described in detail. FIGS. 4a to 4d are process views showing a process for preparing an organic light-emitting display device. Firstly, a frit 150 is applied in a linear shape in a point spaced apart at a predetermined distance from an edge of an encapsulation substrate 200, and the frit 150 is formed in a point corresponding to a non-pixel region 100a of the substrate 100, as described later. In an embodiment, the height of the frit 150 ranges from about 10 to about 20 μm The frit 150 is applied to the encapsulation substrate 200 at a state of the frit paste, sintered to remove moisture or organic binders that are all included in the paste, and then cured. (See FIG. 4a)

In an embodiment, a substrate 100 including a pixel region including an organic light-emitting diode, and a non-pixel region in which a driver integrated circuit and a metal wiring, etc. are formed is provided, and an encapsulation substrate 200 is coalesced. (See FIG. 4b) Next, a laser or an infrared ray is irradiated to the frit 150 between the substrate 100 and the encapsulation substrate 200, both coalesced to each other, to melt the frit 150 between the substrate 100 and the encapsulation substrate 200. In an embodiment, the irradiated laser or infrared ray, used herein, has, for example, a wavelength of about 800 to about 1200 nm (and in another embodiment, about 810 nm), its power ranges from about 25 to about 45 watt. In an embodiment, the region except the frit is masked. Layers of cooper and aluminum may be used as materials of the mask. The substrate 100 and the encapsulation substrate 200 are attached to each other by curing the melted frit 150. (See FIG. 4c)

In an embodiment, subsequently to the formation of the frit, a reinforcement material or structure 160 is formed in a gap between the substrate 100 and the encapsulation substrate 200, and side surfaces of the substrate and the encapsulation substrate. In an embodiment, gaps exist in the sides of the substrate 100 and the encapsulation substrate 200 since the frit 150 is not formed adjacent to the edges, but formed spaced apart at a predetermined distance from the sides of the substrates. The liquid material for reinforcement material 160 is applied to or injected into the edge regions or sides by using a dispenser, and then cured. In an embodiment, the gap between the substrate 100 and the encapsulation substrate 200 is identical to the height of the frit such that, when a liquid for the reinforcement material is supplied on the sides or edges, then the liquid can be moved into gaps by a capillary phenomenon, and then cured. (See FIG. 4d) In an embodiment, the material which formed on the side surface of the substrate 100 and the encapsulation substrate 200 may be optionally removed. In an embodiment, if the materials of the reinforcement material 160 are naturally cured, then preparation of an organic light-emitting device is completed without an additional process. In another embodiment, if the materials of the reinforcement material 160 are UV-cured, then there is required an additional process for masking and irradiating the reinforcement material 160 with UV ray. In an embodiment, and if the materials of the reinforcement material 160 are thermally cured, then there is required an additional process for subjecting the heat to the reinforcement material.

Figure 5A:
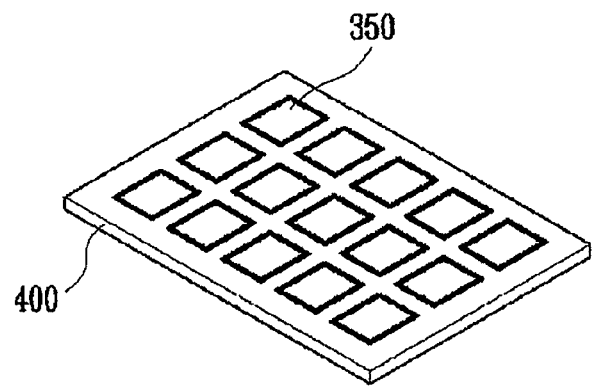
FIGS. 5a to 5d show a process for packaging an organic light-emitting display device according to an embodiment of the present invention.
Figure 5B:
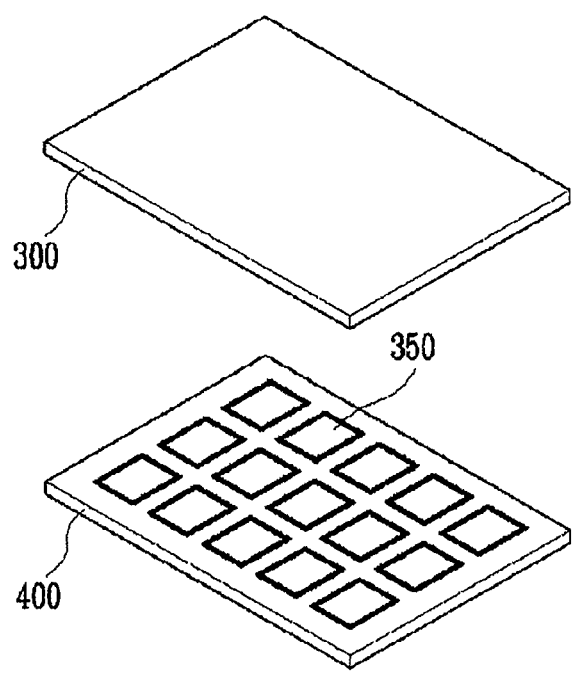
Figure 5C:
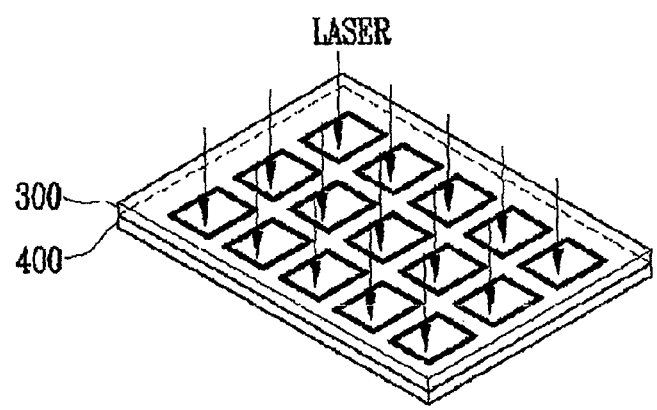
Figure 5D:
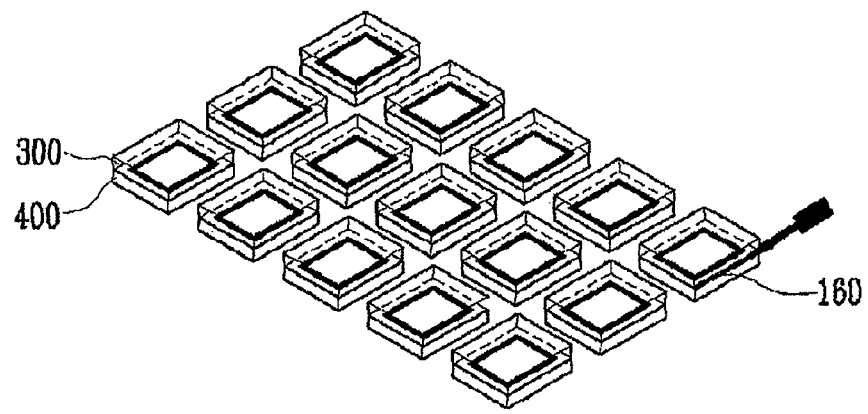
Figure 6A:
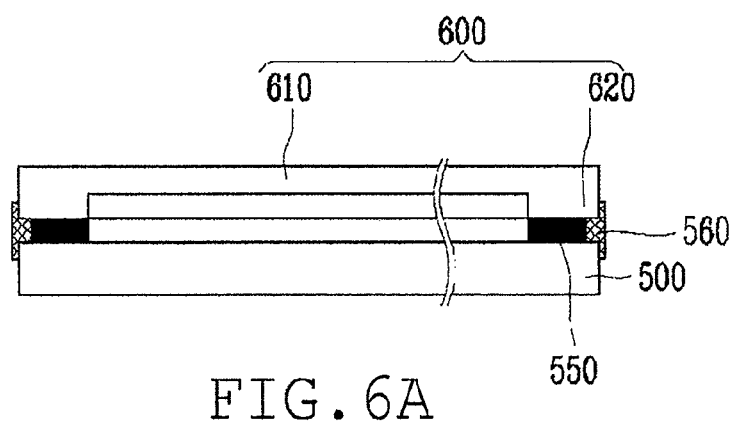
FIGS. 6A and 6B are cross-sectional views showing an organic light-emitting display device according to another embodiment of the present invention.
Figure 6B:
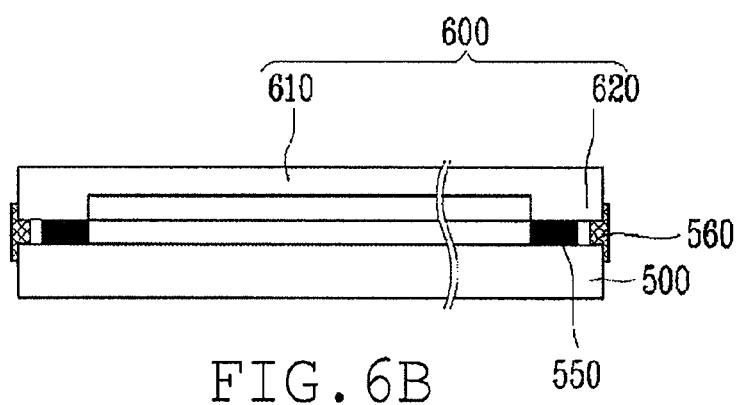

The aforementioned method is the method used when an organic light-emitting display device is prepared in a unit cell. In an embodiment, a method in which a plurality of organic light-emitting display devices is prepared may be provided, which will be described with reference to FIGS. 5a to 5e. In an embodiment, a frit paste 350 is applied onto a mother plate 400, from which a plurality of encapsulation substrates are formed, at positions spaced apart from imaginary lines which will be edges of portions which are formed into each of the encapsulation substrates. In an embodiment, the frit paste 350 includes a glass material, a laser-absorbing material, a filler for reducing a thermal expansion coefficient, an organic binder, etc. In an embodiment, the frit paste is sintered at a temperature of approximately 400 to 600☐ after the frit paste is applied thereto, wherein the organic binder or moisture, etc. are evaporated in the sintering procedure. (See FIG. 5a)

Subsequently, the encapsulation substrate mother plate 400 in which the frit 350 is sintered is coalesced to a substrate mother plate 300 prepared separately. (See FIG. 5b) Subsequently, the substrate mother plate 300 and the encapsulation substrate mother plate 400 are attached to each other by irradiating a laser or an infrared ray to the frit 350 formed between the substrate mother plate 300 and the mother plate 400 of the encapsulation substrate. In an embodiment, the irradiated laser or infrared ray has, for example, a wavelength of about 810 to about 1200 nm, its power ranges from about 25 to about 45 watt, a region where the laser or infrared ray may be irradiated is masked, and the laser or infrared ray may be irradiated in a direction toward the encapsulation substrate, the substrate, or in both directions. In embodiments, the insides of the substrate and the encapsulation substrate are maintained at a lower pressure than an atmospheric pressure when the substrate and the encapsulation substrate are coalesced to each other. (See FIG. 5c)

In the illustrated embodiment, subsequently, the substrate mother plate 300 and encapsulation substrate mother plate 400 which are coalesced to each other are scribed or cut into a plurality of separate display devices, and organic light-emitting display devices may be prepared by applying a reinforcement material 360 to the side surfaces of the display devices by using a dispenser. (See FIG. 5d) In one embodiment, only the encapsulation substrate may be scribed, the separate encapsulation substrate is coalesced to correspond to only a certain region of the substrate.

Hereinafter, another embodiment of an organic light-emitting display device according to the present invention will be described in detail. An encapsulation substrate 600 used in this embodiment does not have a usual plate shape, but a cap shape, and therefore the encapsulation substrate 600 will be described in brief on the basis of parts different to the other embodiments discussed above. If a capped encapsulation substrate 600 is used, then the amount of frits 550 to be used may be reduced and the time needed to melt the frit 550 by irradiating a laser or an infrared ray may be also shortened.

In the illustrated embodiment, the encapsulation substrate 600 includes an encapsulation unit 610 and a spacer unit 620. The encapsulation unit 610 is an encapsulation plate corresponding to an organic light-emitting unit in which organic light-emitting diodes of the substrate 500 is formed, and the spacer unit 620 may separate the substrate 500 and the encapsulation substrate 600 apart at a predetermined distance. In an embodiment, the frit 550 is formed on the spacer unit 620, and applied in a linear shape at a position spaced apart with a predetermined distance from an edge toward the inner side, and then cured.

The spacer unit 620 of the encapsulation substrate 600 and the substrate 500 are coalesced to each other, and then the encapsulation substrate 600 and the substrate 500 are attached to each other by irradiating a laser or an infrared ray to the frit 550 formed on the spacer unit 620. In an embodiment, a liquid of a reinforcement material 560 is applied to gaps between the substrate 500 and the spacer unit 620 of the encapsulation substrate 600 outside the frit 550, and the liquid of the reinforcement material 560 moves into gaps by a capillary phenomenon.

The present invention has been described in detail with reference to embodiments. However, it would be appreciated that modifications and changes might be made to the embodiments without departing from the principles and spirit of the invention. For example, modifications and changes may be made in a method for forming a reinforcement material, and a position of a reinforcement material.

Although a few embodiments of the present invention have been shown and described, it would be appreciated by those skilled in the art that changes might be made in the embodiments without departing from the principles and spirit of the present invention, the scope of which is defined in the claims and their equivalents.

What is claimed is:

1. A method of making an organic light-emitting display device, the method comprising:
   providing an unfinished device comprising:
      a first substrate,
      a second substrate placed over the first substrate,
      an array of organic light-emitting pixels interposed between the first and second substrates, and
      a frit seal interposed between the first substrate and the second substrate while completely surrounding the array, wherein the frit seal, the first substrate and the second substrate in combination define an enclosed space, in which the array is located; and
   forming a structure outside the enclosed space such that the structure is interposed only between the first and second substrates, wherein the structure surrounds the frit seal without any gaps in circumference of the frit seal and the structure.

2. The method of claim 1, wherein forming comprises:
   placing a curable liquid material in the vicinity of the frit seal while not contacting the frit seal, whereby at least part of the curable liquid material spontaneously moves toward the fit seal by capillary action; and
   solidifying the curable liquid material, thereby forming the structure.

3. The method of claim 1, wherein the first substrate comprises a first surface and the second substrate comprises a second surface facing the first surface, wherein the first surface, second surface and the frit seal together define a gap outside the enclosed space, and wherein forming the structure comprises applying a curable material into the gap.

4. The method of claim 3, wherein the curable material is liquid, and the curable material spontaneously moves toward the fit seal when being applied into the gap.

5. The method of claim 3, wherein forming the structure further comprises curing the curable material by activating a curing process of the curable material.

6. The method of claim 3, wherein the gap is formed throughout the periphery of the unfinished device, and wherein forming the structure comprises applying the curable material into the gap substantially throughout the periphery of the unfinished device.

7. The method of claim 1, wherein forming the structure comprises:
   placing a curable material in vicinity of the frit seal; and
   curing the curable material.

8. The method of claim 1, wherein forming the structure comprises:
   providing a dispenser containing the curable material;
   applying the curable material onto a surface of the unfinished device using the dispenser, whereby a portion of the curable material is formed between the first and second substrates; and
   curing the curable material.

9. The method of claim 1, wherein forming the structure comprises:
   providing a medium retaining the curable material;
   applying the curable material on a surface of the unfinished device using the medium, whereby a portion of the curable material is formed between the first and second substrates; and
   curing the curable material.

10. The method of claim 1, wherein forming the structure comprises:
    providing a curable material in liquid;
    dipping a periphery of the unfinished device into the liquid curable material, whereby a portion of the liquid curable material is formed between the first and second substrates; and
    curing the curable material.

11. The method of claim 1, wherein the structure contacts the frit seal along an entire outer perimeter of the frit seal.

12. The method of claim 1, wherein the structure does not contact the fit seal.

13. The method of claim 1, wherein the first substrate comprises a first edge and the second substrate comprises a second edge extending generally along the first edge, and wherein the frit seal extends along the first and second edge while apart from the first and second edges, wherein the structure contacts the first and second substrates and extends along the first and second edges.

14. The method of claim 1, wherein the structure contacts the first substrate.

15. The method of claim 1, wherein the structure is connected to the first substrate via another material between the structure and the first substrate.

16. The method of claim 1, wherein the structure comprises a cured polymeric resin.

* * * * *